United States Patent
Deane et al.

(10) Patent No.: US 8,525,016 B2
(45) Date of Patent: Sep. 3, 2013

(54) THERMOELECTRIC DEVICES INCLUDING THERMOELECTRIC ELEMENTS HAVING OFF-SET METAL PADS AND RELATED STRUCTURES, METHODS, AND SYSTEMS

(75) Inventors: Philip A. Deane, Durham, NC (US); Ramaswamy Mahadevan, Chapel Hill, NC (US); Edward P. Siivola, Raleigh, NC (US)

(73) Assignee: Nextreme Thermal Solutions, Inc., Durham, NC (US)

( * ) Notice: Subject to any disclaimer, the term of this patent is extended or adjusted under 35 U.S.C. 154(b) by 529 days.

(21) Appl. No.: 12/731,546

(22) Filed: Mar. 25, 2010

(65) Prior Publication Data

US 2010/0252087 A1    Oct. 7, 2010

Related U.S. Application Data

(60) Provisional application No. 61/211,721, filed on Apr. 2, 2009.

(51) Int. Cl.
*H01L 35/02* (2006.01)
*H01L 37/00* (2006.01)

(52) U.S. Cl.
USPC .......................................... 136/230; 136/201

(58) Field of Classification Search
USPC .................... 136/201, 230; 438/54
See application file for complete search history.

(56) References Cited

U.S. PATENT DOCUMENTS

| | | | |
|---|---|---|---|
| 3,615,870 A | 10/1971 | Crouthamel | |
| 4,049,469 A | 9/1977 | Kolomoets et al. | |
| 5,228,923 A | 7/1993 | Hed | |
| 5,950,067 A | 9/1999 | Maegawa et al. | |
| 6,162,985 A | 12/2000 | Parise | |
| 6,300,150 B1 | 10/2001 | Venkatasubramanian | |
| 6,800,933 B1 | 10/2004 | Mathews et al. | |
| 7,164,077 B2 | 1/2007 | Venkatasubramanian | |
| 7,235,735 B2 | 6/2007 | Venkatasubramanian | |
| 2002/0046762 A1 | 4/2002 | Rossi | |
| 2003/0099279 A1 | 5/2003 | Venkatasubramanian et al. | |
| 2003/0209014 A1 | 11/2003 | Chang et al. | |

(Continued)

FOREIGN PATENT DOCUMENTS

FR    2 320 637 A1    3/1977
JP    2002-111080    4/2002

(Continued)

OTHER PUBLICATIONS

International Search Report and Written Opinion of the International Searching Authority corresponding to International Application No. PCT/US2010/028775; Date of Mailing: Mar. 22, 2011; 10 pages.

(Continued)

*Primary Examiner* — Jonathan Johnson
*Assistant Examiner* — Tamir Ayad
(74) *Attorney, Agent, or Firm* — Myers Bigel Sibley & Sajovec, P.A.

(57) ABSTRACT

A thermoelectric device may include a thermoelectric element including a layer of a thermoelectric material and having opposing first and second surfaces. A first metal pad may be provided on the first surface of the thermoelectric element, and a second metal pad may be provided on the second surface of the thermoelectric element. In addition, the first and second metal pads may be off-set in a direction parallel with respect to the first and second surfaces of the thermoelectric element. Related methods are also discussed.

24 Claims, 5 Drawing Sheets

(56) References Cited

U.S. PATENT DOCUMENTS

| | | |
|---|---|---|
| 2004/0113076 A1 | 6/2004 | Guo et al. |
| 2006/0086118 A1 | 4/2006 | Venkatasubramanian et al. |
| 2006/0128059 A1 | 6/2006 | Ahn et al. |
| 2006/0289050 A1 | 12/2006 | Alley et al. |
| 2006/0289052 A1 | 12/2006 | O'Quinn et al. |
| 2007/0028956 A1 | 2/2007 | Venkatasubramanian |
| 2007/0089773 A1 | 4/2007 | Koester et al. |
| 2007/0215194 A1 | 9/2007 | Bharathan et al. |
| 2009/0000652 A1 | 1/2009 | von Windheim et al. |

FOREIGN PATENT DOCUMENTS

| | | |
|---|---|---|
| JP | 2002-232028 | 8/2002 |
| WO | WO 2004/049463 | 6/2004 |
| WO | WO 2005/074463 | 8/2005 |

OTHER PUBLICATIONS

Press Release, Marlow Industries "New, Low-Profile Planar TEC Cools Detectors, Drives Cost Down" Apr. 29, 2008, Planar TEC, http://www.marlow.com/AboutMarlow/PressReleases/press_release_Apr_29_2008.htm.

Press Release, Marlow Industries "New, Low-Profile Planar TEC Cools Detectors, Drives Cost Down" Apr. 29, 2008, ThomasNet Industrial Newsroom, http://news.thomasnet.com/printreadycn.html?prid=816927.

Fontanazza "A Cooler Way to Stop Seizures" *Medical Device & Diagnostic Industry Magazine* pp. 1-2 (2005).

Ettenberg et al. "A New n-type and Improved p-type Pseudo-ternary ($Bi_2Te_3$)($Sb_2Se_3$) Alloy for Peltier Cooling" $15^{th}$ International Conference on Thermoelectrics, IEEE Catalog No. 96TH8169 pp. 52-56 (1996).

Kloeser "High-Performance flip chip packages with copper pillar bumping" *Global SMT & Packaging* pp. 28-31 (May 2006), www.globalsmt.net.

Rothman "Pathophysiology and therapy of epilepsy" Website of Professor Steven Rothman, M.D. of Washington University in St. Louis: http://neuroscience.wustl.edu/research/faculty.php?id=81.

Snyder et al. "Hot Spot Cooling Using Embedded Thermoelectric Coolers" 22nd IEEE Semi-Therm Symposium, IEEE Catalog No. 1-4244-0154-2 pp. 135-143 (2006).

Venkatasubramanian et al. "Phonon-Blocking Electron-Transmitting Structures" $18^{th}$ International Conference on Thermoelectrics (1999), pp. 100-103.

THERMOELECTRIC DEVICES INCLUDING THERMOELECTRIC ELEMENTS HAVING OFF-SET METAL PADS AND RELATED STRUCTURES, METHODS, AND SYSTEMS

RELATED APPLICATION

The present application claims the benefit of priority from U.S. Provisional Application No. 61/211,721 entitled "Methods of Increasing A Ratio Of Electrical Resistance To Contact Resistance In Thin Film Thermoelectric Devices And Related Structures" filed Apr. 2, 2009, the disclosure of which is hereby incorporated herein in its entirety by reference.

FIELD OF THE INVENTION

The present invention relates to the field of electronics, and more particularly, to thermoelectric devices and related structures, methods, and systems.

BACKGROUND

Thermoelectric materials may be used to provide cooling and/or power generation according to the Peltier effect. Thermoelectric materials are discussed, for example, in the reference by Venkatasubramanian et al. entitled "Phonon-Blocking Electron-Transmitting Structures" (18th International Conference On Thermoelectrics, 1999), the disclosure of which is hereby incorporated herein in its entirety by reference.

Application of solid state thermoelectric cooling may be expected to improve the performance of electronics and sensors such as, for example, RF receiver front-ends, infrared (IR) imagers, ultra-sensitive magnetic signature sensors, and/or superconducting electronics. Bulk thermoelectric materials typically based on p-$Bi_xSb_{2-x}Te_3$ and n-$Bi_2Te_{3-x}Se_x$ alloys may have figures-of-merit (ZT) and/or coefficients of performance (COP) which result in relatively poor thermoelectric device performance.

The performance of a thermoelectric device may be a function of the figure(s)-of-merit (ZT) of the thermoelectric material(s) used in the device, with the figure-of-merit being given by:

$$ZT=(\alpha^2 T\sigma/K_T),\qquad\text{(equation 1)}$$

where $\alpha$, T, $\sigma$, and $K_T$ are the Seebeck coefficient, absolute temperature, electrical conductivity, and total thermal conductivity, respectively. The material-coefficient Z can be expressed in terms of lattice thermal conductivity ($K_L$), electronic thermal conductivity ($K_e$) and carrier mobility ($\mu$), for a given carrier density ($\rho$) and the corresponding $\alpha$, yielding equation (2) below:

$$Z=\alpha^2\sigma/(K_L+K_e)=\alpha^2/[K_L(\mu\rho q)+L_0T)],\qquad\text{(equation 2)}$$

where, $L_0$ is the Lorenz number (approximately $1.5\times10^{-8}$ $V^2/K^2$ in non-degenerate semiconductors). State-of-the-art thermoelectric devices may use alloys, such as p-$Bi_xSb_{2-x}Te_{3-y}Se_y$ (x≈0.5, y≈0.12) and n-$Bi_2(Se_yTe_{1-y})_3$ (y≈0.05) for the 200 degree K to 400 degree K temperature range. For certain alloys, $K_L$ may be reduced more strongly than $\mu$ leading to enhanced ZT.

A ZT of 0.75 at 300 degree K in p-type $Bi_xSb_{2-x}Te_3$ (x≈1) was reported forty years ago. See, for example Wright, D. A., Nature vol. 181, pp. 834 (1958). Since then, there has been relatively modest progress in the ZT of thermoelectric materials near 300 degree K (i.e., room temperature). A ZT of about 1.14 at 300 degree K for bulk p-type $(Bi_2Te_3)_{0.25}$ $(Sb_2Te_3)_{0.72}(Sb_2Se_3)$ alloy has been discussed for example, in the reference by Ettenberg et al, entitled "A New N-Type And Improved P-Type Pseudo-Ternary $(Bi_2Te_3)(Sb_2Te_3)$ $(Sb_2Se_3)$ Alloy For Peltier Cooling," (Proc. of 15th Inter. Conf. on Thermoelectrics, IEEE Catalog. No. 96TH8169, pp. 52-56, 1996), the disclosure of which is hereby incorporated herein in its entirety by reference.

SUMMARY

According to some embodiments of the present invention, a thermoelectric device may include a thermoelectric element including a layer of a thermoelectric material and having opposing first and second surfaces. A first metal pad may be provided on the first surface of the thermoelectric element, and a second metal pad may be provided on the second surface of the thermoelectric element. Moreover, the first and second metal pads may be off-set in a direction parallel with respect to the first and second surfaces of the thermoelectric element.

A thermally conductive header may be provided adjacent the thermoelectric element with the second metal pad being mechanically coupled between the thermally conductive header and the thermoelectric element. Moreover, the thermoelectric element may be an N-type thermoelectric element, and the thermoelectric device may further include a P-type thermoelectric element including a layer of a P-type thermoelectric material and having opposing first and second surfaces. A third metal pad may be mechanically coupled between the first surface of the P-type thermoelectric element and the thermally conductive header. A fourth metal pad may be provided on the second surface of the P-type thermoelectric element, and the third and fourth metal pads may be off-set in a direction parallel with respect to the first and second surfaces of the P-type thermoelectric element. In addition, an electrically conductive trace of the thermally conductive header may provide electrical coupling between the second and third metal pads to define a path of current flow from the first metal pad through the N-type thermoelectric element to the second metal pad through the electrically conductive trace to the third metal pad and through the P-type thermoelectric element to the fourth metal pad. A second thermally conductive header may also be provided with the first metal pad being mechanically coupled between the second thermally conductive header and the N-type thermoelectric element and with the fourth metal pad being mechanically coupled between the P-type thermoelectric element and the second thermally conductive header.

The thermoelectric material may be a crystalline semiconductor material, and more particularly, the thermoelectric material may be a single crystal semiconductor material, such as bismuth telluride. Moreover, the first and second metal pads may be non-overlapping. In addition, a third metal pad may be provided on the second surface of the thermoelectric element with the first and third metal pads being off-set in the direction perpendicular with respect to the first and second surfaces of the thermoelectric element, and with second and third metal pads being spaced apart on the second surface of the thermoelectric element. The thermoelectric element may have a first resistivity in the direction parallel with respect to the first and second surfaces of the thermoelectric element that is less than a second resistivity in a direction perpendicular with respect to the first and second surfaces.

According to some other embodiments of the present invention, a method of forming a thermoelectric device may include providing a thermoelectric element including a layer of a thermoelectric material and having opposing first and second surfaces. A first metal pad may be formed on the first surface of the thermoelectric element, and a second metal pad may be formed on the second surface of the thermoelectric element. Moreover, the first and second metal pads may be off-set in a direction parallel with respect to the first and second surfaces of the thermoelectric element.

A thermally conductive header including an electrically conductive trace thereon may be provided, and the second metal pad may be electrically and mechanically coupled to the electrically conductive trace. Moreover, the second metal pad may be electrically and mechanically coupled to the electrically conductive trace before forming the first metal pad. The thermoelectric element may be an N-type thermoelectric element, and a P-type thermoelectric element may be provided including a layer of a P-type thermoelectric material and having opposing first and second surfaces. A third metal pad may be formed on the first surface of the P-type thermoelectric element, and the third metal pad may be electrically and mechanically coupled to the electrically conductive trace of the thermally conductive header so that the third metal pad is electrically and mechanically coupled between the first surface of the P-type thermoelectric element and the electrically conductive trace of the thermally conductive header. A fourth metal pad may be formed on the second surface of the P-type thermoelectric element, and the third and fourth metal pads may be off-set in a direction parallel with respect to the first and second surfaces of the P-type thermoelectric element. The electrically conductive trace of the thermally conductive header may thus provide electrical coupling between the second and third metal pads to define a path of current flow from the first metal pad through the N-type thermoelectric element to the second metal pad through the electrically conductive trace to the third metal pad and through the P-type thermoelectric element to the fourth metal pad.

A second thermally conductive header may be provided, and the first metal pad may be mechanically coupled to the second thermally conductive header so that the first metal pad is mechanically coupled between the second thermally conductive header and the N-type thermoelectric element. The fourth metal pad may be mechanically coupled to the second thermally conductive header so that the fourth metal pad is mechanically coupled between the second thermally conductive header and the P-type thermoelectric element.

The thermoelectric material may be a crystalline semiconductor material, and more particularly, the thermoelectric material may be a single crystal semiconductor material, such as bismuth telluride. The first and second metal pads may be non-overlapping. A third metal pad may be formed on the second surface of the thermoelectric element wherein the first and third metal pads are off-set in the direction perpendicular with respect to the first and second surfaces of the thermoelectric element, and the second and third metal pads may be spaced apart on the second surface of the thermoelectric element. The thermoelectric element may have a first resistivity in the direction parallel with respect to the first and second surfaces of the thermoelectric element that is less than a second resistivity in a direction perpendicular with respect to the first and second surfaces.

DETAILED DESCRIPTION

Figure 1:
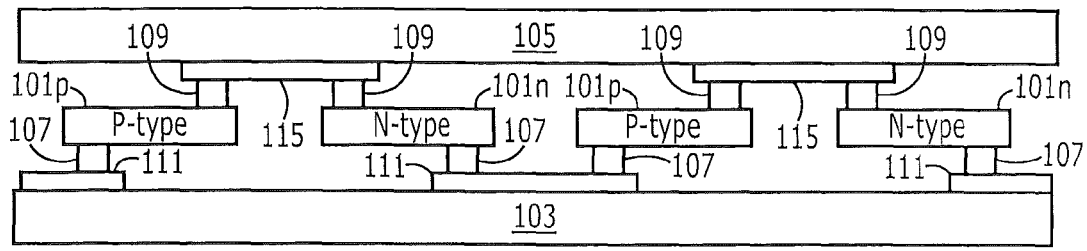
FIG. 1 is a cross sectional view illustrating a thermoelectric device with off-set metal pads according to some embodiments of the present invention.

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc, may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a structure illustrated with angular features will, typically, have rounded or curved features. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

In a thermoelectric module, heat may be pumped from a first header to a second header responsive to a current through serially coupled P-type and N-type thermoelectric elements thereby cooling the first header and/or a component thermally coupled to the first header. By reversing the current, heat may be pumped from the second header to the first header thereby heating the first header and/or a component thermally coupled to the first header. Moreover, an electrical potential/current may be generated responsive to a thermal gradient between the first and second headers. Thermoelectric structures are discussed, for example, in U.S. Publication Nos. 20060289052 (entitled "Methods Of Forming Thermoelectric Devices Including Conductive Posts And/Or Different Solder Materials And Related Methods And Structures"), 20060289050 (entitled "Methods Of Forming Thermoelectric Devices Including Electrically Insulating Matrixes Between Conductive Traces And Related Structures"), 20060086118 (entitled "Thin Film Thermoelectric Devices For Hot-Spot Thermal Management In Microprocessors And Other Electronics"), 20060289052 (entitled "Methods Of Forming Thermoelectric Devices Including Conductive Posts And/Or Different Solder Materials And Related Methods And Structures"), 20070089773 (entitled "Methods Of Forming Embedded Thermoelectric Coolers With Adjacent Thermally Conductive Fields And Related Structures"), 20070215194 (entitled "Methods Of Forming Thermoelectric Devices Using Islands Of Thermoelectric Material And Related Structures"), 20090000652 (entitled "Thermoelectric Structures Including Bridging Thermoelectric Elements"), and 2009/0072385 (entitled "Electronic Assemblies Providing Active Side Heat Pumping And Related Methods And Structures"), the disclosures of which are hereby incorporated herein in their entirety by reference.

P-type and N-type thermoelectric elements may be provided using semiconductor thin-film deposition techniques, and a thermoelectric module may be fabricated using microfabrication techniques. In such a thermoelectric module, a plurality of P and N type thermoelectric elements may be electrically coupled in series (with the series connections alternating between P-type and N-type thermoelectric elements) and thermally coupled in parallel between first and second thermally conductive headers. For example, thin-films of P-type and N-type thermoelectric materials (e.g., bismuth telluride or $Bi_2Te_3$) may be epitaxially grown on respective substrates and then diced to provide substantially single crystal P-type and N-type thermoelectric elements that are then soldered to respective conductive traces on the headers. In an alternative, thermoelectric elements may be provided using bulk (e.g., thicker and non-crystalline) thermoelectric materials. By using thin-film substantially single crystal thermoelectric elements, a size of a thermoelectric module may be reduced and performance may be improved.

According to some embodiments of the present invention illustrated in FIG. 1, a then noelectric device may include a plurality of P-type thermoelectric elements $101p$ and N-type thermoelectric elements $101n$ electrically coupled in series and thermally coupled in parallel between first and second thermally conductive headers 103 and 105. Moreover, metal contacts 107 may provide electrical and mechanical coupling between P-type and N-type thermoelectric elements $101p$ and $101n$ and thermally conductive header 103, and metal contacts 109 may provide electrical and mechanical coupling between P-type and N-type thermoelectric elements $101p$ and $101n$ and thermally conductive header 105. In addition, electrically conductive traces 111 (e.g., copper traces) of header 103 may provide selective electrical coupling between metal contacts 107, and electrically conductive traces 115 (e.g., copper traces) of header 105 may provide selective electrical coupling between metal contacts 109.

Conductive traces 111 and 115, metal contacts 107 and 109, and thermoelectric elements $101p$ and $101n$ may be arranged so that P-type and N-type thermoelectric elements $101p$ and $101n$ are alternatingly connected in a series electrical circuit. Accordingly, electrical current through P-type thermoelectric elements $101p$ may be in a direction from a respective conductive trace 111 (on header 103) through metal contact 107, P-type thermoelectric element $101p$, and metal contact 109 to a respective conductive trace 109 (on header 105), while electrical current through N-type thermoelectric elements $101n$ may be in a direction from a respective conductive trace 109 (on header 105) through metal contact 107, N-type thermoelectric element $101n$, and metal contact 107 to a respective conductive trace 111 (on header 103). In the same structure, the current may be reversed so that electrical current through N-type thermoelectric elements $101n$ may be in a direction from a respective conductive trace 111 (on header 103) through metal contact 107, N-type thermoelectric element 101n, and metal contact 109 to a respective conductive trace 109 (on header 105), while electrical current through P-type thermoelectric elements 101p may be in a direction from a respective conductive trace 109 (on header 105) through metal contact 107, P-type thermoelectric element 101p, and metal contact 107 to a respective conductive trace 111 (on header 103). One direction of current flow may provide thermoelectric pumping of heat from header 105 to header 103, while the other direction of current flow may provide thermoelectric pumping of heat from header 103 to header 105. According to still other embodiments of the present invention, an electrical signal may be generated responsive to a difference in temperature between the two headers 103 and 105 to provide a sensor and/or to provide power generation.

By providing that metal contacts 107 and 109 on opposite sides of a same thermoelectric element are laterally off-set in a direction parallel with respect to surfaces of the thermoelectric element, electrical current through the thermoelectric element (101p or 101n) between the metal contacts 107 and 109 may be forced to flow in a lateral direction parallel with respect to surfaces of the thermoelectric element. A lateral current path through each thermoelectric element may thus be provided even though the current path traverses opposite sides of the thermoelectric element. Such a direction of current flow may favorably exploit transport characteristics of the thermoelectric elements. More particularly, the Applicants theorize that resistivity characteristics of thin-film epitaxial thermoelectric elements 101p and 101n may be anisotropic such that a resistivity in a direction perpendicular with respect to a growth plane of the thermoelectric element (i.e., in a direction of a thickness of the thermoelectric element) may be greater than a resistivity in a direction parallel with respect to the growth plane of the thermoelectric element (i.e., in a direction perpendicular with respect to the thickness of the thermoelectric element).

As shown in FIG. 1, off-set metal contacts 107 and 109 on opposite sides of a same thermoelectric element may be completely non-overlapping to provide that all of the current through the thermoelectric element must traverse in the direction parallel with respect to the surfaces of the thermoelectric element over at least some length of the thermoelectric element. According to other embodiments of the present invention, the off-set metal contacts 107 and 109 may be partially overlapping so that at least a component of the current through the thermoelectric element must traverse in the direction parallel with respect to the surfaces of the thermoelectric element.

Each thermoelectric element 101p and 101n may include a layer of a thin-film crystalline thermoelectric semiconductor material such as bismuth telluride ($Bi_2Te_3$). More particularly, each thermoelectric element 101p and 101n may be formed by epitaxial deposition on a single crystal growth substrate (wherein the growth substrate is removed) so that each thermoelectric element includes a single crystal thin-film thermoelectric semiconductor material. Each thermoelectric element 101p and 101n may have a thickness (in the vertical direction of FIG. 1) of less than about 100 micrometers, more particularly less than about 50 micrometers, and still more particularly, in the range of about 1 micrometers to about 20 micrometers. A length of a thermoelectric element (in a horizontal direction of FIG. 1) may be at least ten times greater than its thickness, and a width of a thermoelectric element (into the page of FIG. 1) may be at least ten times greater than its thickness. For example, each thermoelectric element may have a thickness no greater than about 10 micrometers, a length of at least about 100 micrometers, and a width of at least about 100 micrometers. According to some embodiments of the present invention, each thermoelectric element may have a length that is at least about 20 times greater than its thickness. For example, each thermoelectric element may have a thickness of about 10 micrometers, a length of about 250 micrometers, and a width of about 100 micrometers.

Each metal contact may include at least one solder coupling between the thermoelectric element and conductive trace. More particularly each metal contact may include a copper layer (also referred to as a copper post or pillar) and at least one solder layer between the copper layer and the thermoelectric element and/or between the copper layer and the conductive trace. Examples of copper post/pillar structures for metal contacts are discussed in U.S. Publication Nos. 20090072385 (entitled "Electronic Assemblies Providing Active Side Heat Pumping And Related Methods And Structures") and 20060289052 (entitled "Methods Of Forming Thermoelectric Devices Including Conductive Posts And/Or Different Solder Materials And Related Methods And Structures"), the disclosures of which are hereby incorporated herein in their entirety by reference.

As shown in FIG. 1, metal contacts 107 and 109 on opposite sides of a same thermoelectric element 101 may be sufficiently off-set as to be non-overlapping. Stated in other words, metal contacts 107 and 109 may be displaced on opposite sides of a same thermoelectric element 101 so as to be located asymmetrically on the thermoelectric element 101. A separation between metal contacts 107 and 109 on a same thermoelectric element in the direction parallel with respect to surfaces of the thermoelectric element may be at least as great as a width of a contact area of a metal contact 107 or 109 on the thermoelectric element in the same direction, According to some embodiments, the separation may be at least as great as twice the width of the contact area of a metal contact on the thermoelectric element.

Figure 2A:
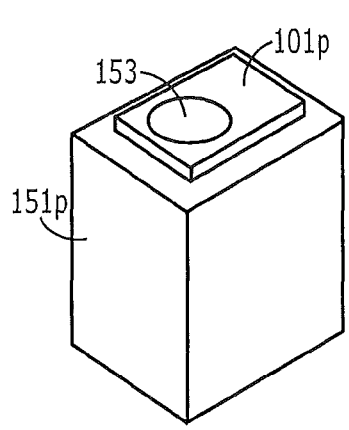
FIGS. 2A and 2B are perspective views illustrating thermoelectric elements on diced portions of growth substrates according to some embodiments of the present invention.

Operations of forming the structure of FIG. 1 will now be discussed with reference to FIGS. 2A-E. A thin film epitaxial P-type layer of a thermoelectric material (such as bismuth telluride) may be deposited on a single crystal growth substrate (such as a gallium arsenide substrate), and patterned (e.g., selectively etched) to provide a plurality of thin film epitaxial P-type thermoelectric elements on the growth substrate. In addition, an off-set connection pad 153 (e.g., a copper connection pad) may be formed on each P-type thermoelectric element. The growth substrate may then be diced to provide a plurality of separate thermoelectric elements 101p and connection pads 153 on respective diced portions of the growth substrate 151p as shown in FIG. 2A. Similarly, a thin film epitaxial N-type layer of a thermoelectric material (such as bismuth telluride) may be deposited on a single crystal growth substrate (such as a gallium arsenide substrate), and patterned (e.g., selectively etched) to provide a plurality of thin film epitaxial N-type thermoelectric elements on the growth substrate. An off-set connection pad 153 (e.g., a copper connection pad) may be formed on each N-type thermoelectric element. The growth substrate may then be diced to provide a plurality of separate diced elements with each diced element including a thermoelectric element 101n and connection pad 153 on a respective diced portion of the growth substrate 151n as shown in FIG. 2B.

Figure 2B:
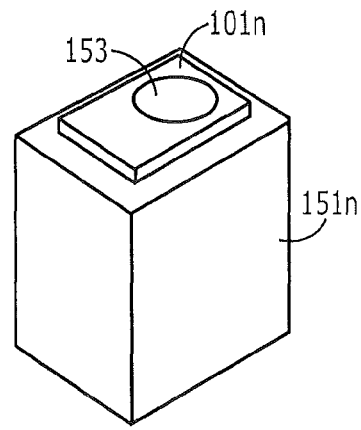
Figure 2C:
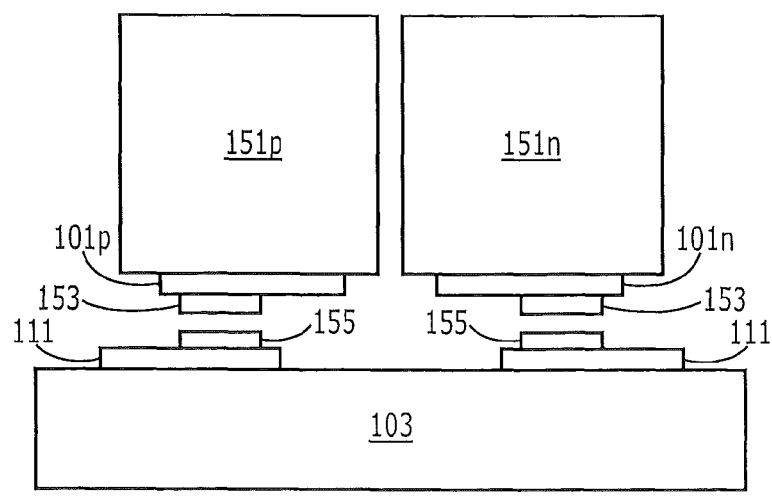
FIGS. 2C, 2D, and 2E are cross sectional views illustrating operations of forming thermoelectric device structures using the thermoelectric elements of FIGS. 2A and 2B according to some embodiments of the present invention.
Figure 2D:
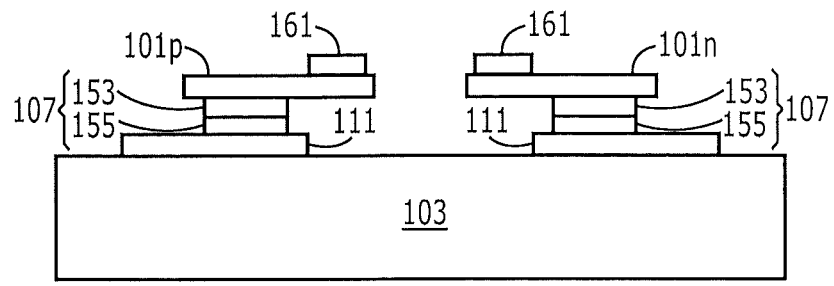

Thermally conductive header 103 may be provided with conductive traces 111 (e.g., copper traces) and solder bumps 155 thereon, and connection pads 153 may be aligned with solder bumps 155 as shown in FIG. 2C. A solder reflow/ bonding operation may then be performed to provide electrical and mechanical coupling between connection pads 153 and conductive traces 111, diced portions of growth substrates 151p and 151n may be selectively removed (e.g., by etching), and off-set connection pads 161 (e.g., copper connection pads) may be formed on the newly exposed surfaces of thermoelectric elements 101p and 101n, as shown in FIG. 2D. Connection pads 153 and solder bumps 155 may together define metal contacts 107 as discussed above with respect to FIG. 1. While metal contacts 107 are discussed as including copper connection pads and solder bumps, metal contact 107 may also include layers of other materials such as barrier layers (e.g., nickel layers), adhesion layers (e.g., chromium/titanium/tungsten layers), passivation layers (e.g., gold/platinum/palladium layers), etc. As used herein, the term metal pad may include: metal contacts 107; connection pads 153; connection pads 153 and/or solder bumps 155; and/or connection pads 153, solder bumps 155, and/or barrier/adhesion/passivation layer(s).

Figure 2E:
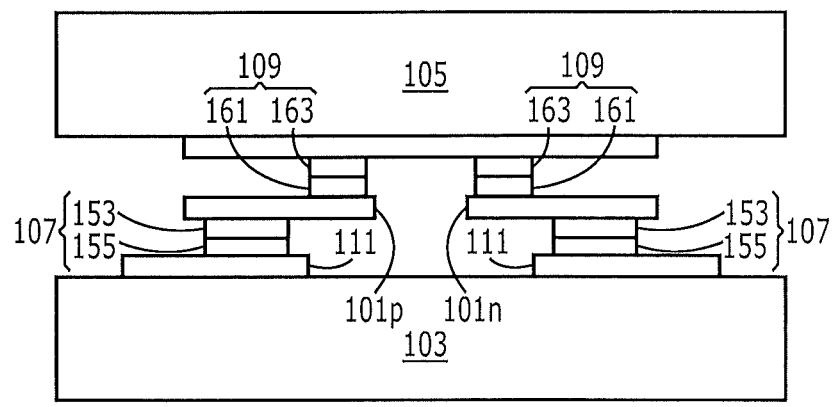

Thermally conductive header 105 may be provided with conductive traces 115 (e.g., copper traces) and solder bumps 163 thereon. As shown in FIG. 2E, connection pads 161 and solder bumps 163 may be aligned and subjected to a solder reflow/bonding operation to provide electrical and mechanical coupling between connection pads 161 and conductive traces 115. Connection pads 161 and solder bumps 163 may together define metal contacts 109 as discussed above with respect to FIG. 1. While metal contacts 109 are discussed as including copper connection pads and solder bumps, metal contact 109 may also include layers of other materials such as barrier layers (e.g., nickel layers), adhesion layers (e.g., chromium/titanium/tungsten layers), passivation layers (e.g., gold/platinum/palladium layers), etc. As used herein, the term metal pad may include: metal contacts 109; connection pads 161; connection pads 161 and/or solder bumps 163; and/or connection pads 161, solder bumps 163, and/or barrier/adhesion/passivation layer(s).

While FIGS. 2A to 2E show only one P-type thermoelectric element 101p and one N-type thermoelectric element 101n during the formation of a thermoelectric device, it will be understood that operations of FIGS. 2A to 2E may be used to provide any number of pairs of P-type and N-type thermoelectric elements 101p and 101n between two thermally conductive headers of a thermoelectric device. Moreover, while FIGS. 2A to 2C show placement of individual P-type and N-type thermoelectric elements, groups of thermoelectric elements may be placed together. For example, growth substrate 151p and/or 151n may be diced so that a module may include a plurality P-type and/or N-type thermoelectric elements 101p and/or 101n for simultaneous placement on thermally conductive header 103.

Figure 3A:
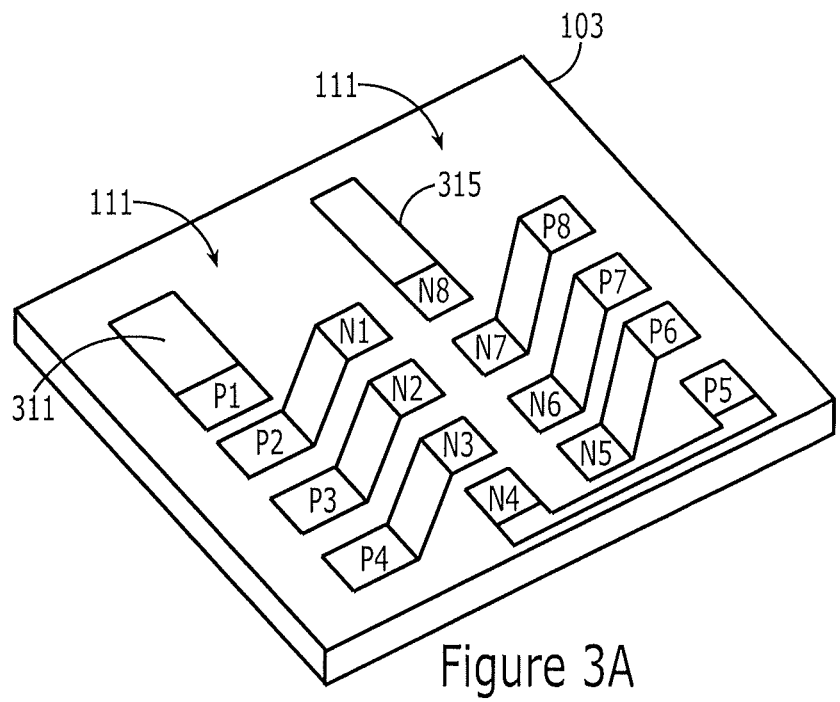
FIGS. 3A and 3B are perspective views illustrating top and bottom thermally conductive headers for thermoelectric elements according to some embodiments of the present invention.

As shown in the plan view of FIG. 3A, for example, thermally conductive header 103 may include a pattern of electrically conductive traces 111 including locations P1 to P8 and N1 to N8 for respective P-type and N-type thermoelectric elements 101p and 101n. Accordingly, growth substrates 151p and 151n may be diced to provide at least 4 respective thermoelectric elements arranged to match respective locations (e.g., P1-P4, N1-N4, P5-P8, and/or N5-N8).

Figure 3B:
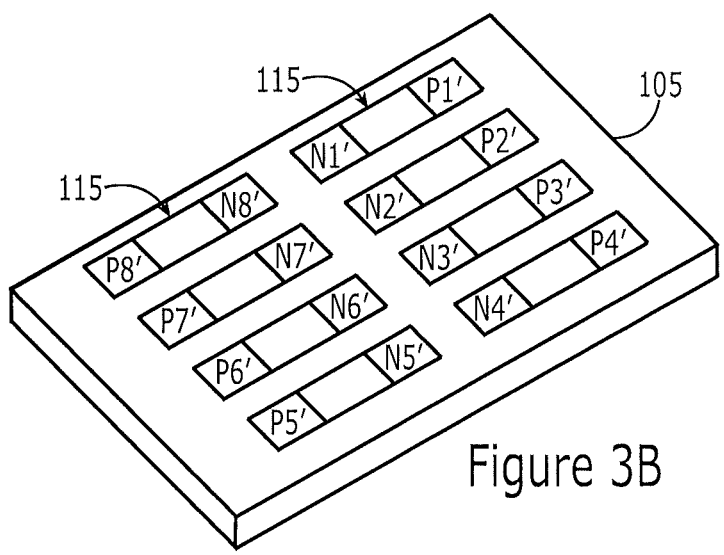

As shown in the plan view of FIG. 3B, thermally conductive header 105 may include a pattern of electrically conductive traces 115 including locations P1' to P8' and N1' to N8' corresponding to locations P1 to P8 and N1 to N8 of header 103 of FIG. 3A. Accordingly, respective P-type thermoelectric elements 101p may be bonded between corresponding pairs of P locations (i.e., P1-P1', P2-P2', P3-P3', etc.) of electrically conductive traces 111 and 115, and respective N-type thermoelectric elements 101n may be bonded between corresponding pairs of N locations (i.e., N1-N1', N2-N2', N3-N3', etc.) with header 105 of FIG. 3B flipped face down adjacent header 103 of FIG. 3A as shown in FIG. 2E. FIG. 2E, for example, may represent a cross section of a portion of a thermoelectric device formed using headers 103 and 105 of FIGS. 3A and 3B taken between locations P1 and N1 and P1' and N1'.

Accordingly, a current flow path may be defined through electrically conductive traces 111 and 115 so that 8 P-type thermoelectric elements and 8 N-type thermoelectric elements are electrically coupled in series. More particularly, a current flow path may be defined from input/output electrode 311 and location P1 up through a first P-type thermoelectric element to location P1', from location P1' across to location N1', from location N1' down through a first N-type thermoelectric element to location N1, from location N1 across to location P2, from location P2 up through a second P-type thermoelectric element to location P2', from location P2' across to location N2', from location N2' down through a second N-type thermoelectric element to location N2, from location N2 across to location P3, from location P3 up through a third P-type thermoelectric element to location P3', from location P3' across to location N3', from location N3' down through a third N-type thermoelectric element to location N3, from location N3 across to location P4, from location P4 up through a fourth P-type thermoelectric element to location P4', from location P4' across to location N4', from location N4' down through a fourth N-type thermoelectric element to location N4, from location N4 around to location P5, from location P5 up through a fifth P-type thermoelectric element to location P5', from location P5' across to location N5', from location N5' down through a fifth N-type thermoelectric element to location N5, from location N5 across to location P6, from location P6 up through a sixth P-type thermoelectric element to location P6', from location P6' across to location N6', from location N6' down through a sixth N-type thermoelectric element to location N6, from location N6 across to location P7, from location P7 up through a seventh P-type thermoelectric element to location P7', from location P7' across to location N7', from location N7' down through a seventy N-type thermoelectric element to location N7, from location N7 across to location P8, from location P8 up through an eighth P-type thermoelectric element to location P8', from location P8' across to location N8', and from location N8' down through an eighth N-type thermoelectric element to location N8 and input/output electrode 315. Accordingly, P-type thermoelectric elements may be bonded between corresponding locations P1 to P8 and P1' to P8' and N-type thermoelectric elements may be bonded between corresponding locations N1 to N8 and N1' to N8' using operations and structures discussed above with respect to FIGS. 2A to 2E.

Figure 4A:
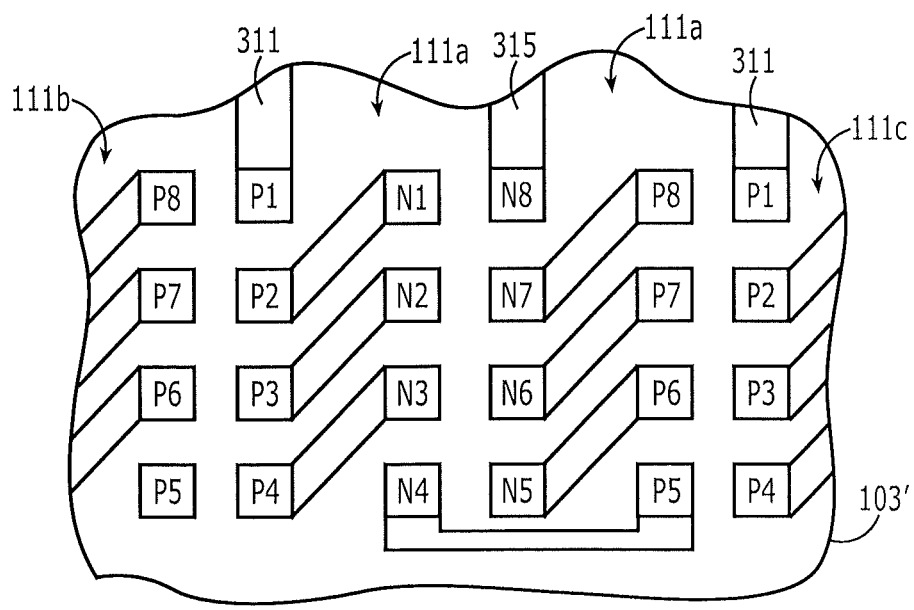
FIG. 4A is a plan view of a portion illustrating a thermally conductive header substrate for a plurality of thermally conductive headers of FIG. 3A.

According to additional embodiments of the present invention shown in FIG. 4, thermally conductive traces 111a, 111b, and 111c for a plurality of thermoelectric devices having the header/trace structure of FIG. 3A may be arranged on a thermally conductive header substrate 103' to provide more efficient fabrication of a plurality of thermoelectric devices. More particularly, conductive traces 111a are the same as discussed above with respect to FIG. 3A, and thermally conductive traces 111b and 111c are provided as identical patterns/structures on opposite sides of traces 111a. While not shown in FIG. 4A, any number of patterns of thermally conductive traces 111 for respective thermoelectric devices may be provided on header substrate 103' in a two dimensional array of rows and columns.

Figure 4B:
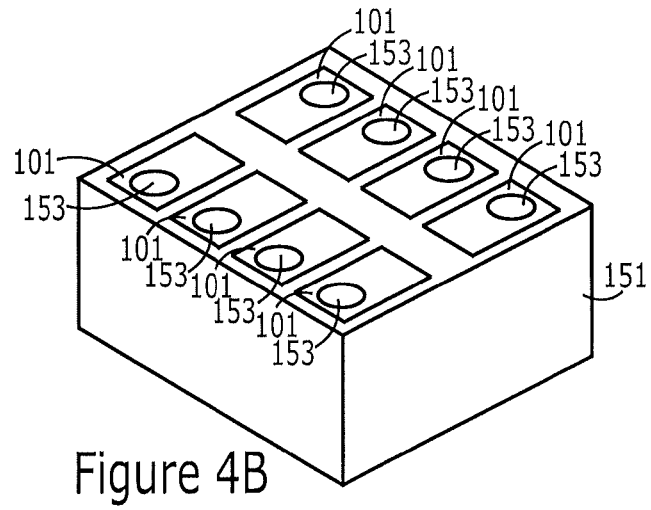
FIG. 4B is a perspective view illustrating a module of thermoelectric elements on a diced portion of a growth substrate according to some embodiments of the present invention.

Moreover, the growth substrates of FIGS. 2A and 2B may be diced to provide eight thermoelectric elements 101p or 101n on a module as shown in FIG. 4B. A module with eight N-type thermoelectric elements 101n provided according to the structure of FIG. 4B may thus be used to simultaneously provide N-type thermoelectric elements with off-set connection pads 153 on locations N1 to N8 of a same thermoelectric device on header substrate 103' of FIG. 4A. A module with eight P-type thermoelectric elements 101p provided according to the structure of FIG. 4B may be used to simultaneously provide P-type thermoelectric elements with off-set connection pads 153 on locations P1 to P4 of a first thermoelectric device and on locations P5 to P8 of a second thermoelectric device adjacent the first thermoelectric device. Pluralities of thermoelectric elements may thus be bonded to traces 111 for a plurality of thermoelectric devices on header substrate 103' using operations as discussed above with respect to FIGS. 2A to 2D, and then headers 105 for each thermoelectric device may be bonded to the thermoelectric elements using operations discussed above with respect to FIGS. 2D to 2E. After bonding the headers 105, header substrate 103' may be diced to provide separate thermoelectric devices with respective thermoelectric headers 103 and 105.

Figure 5:
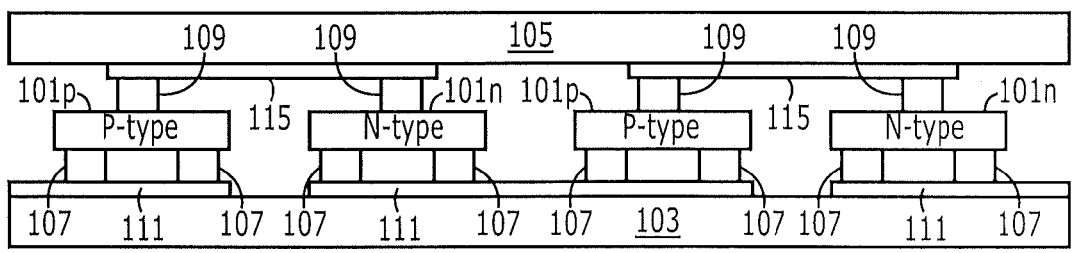
FIG. 5 is a cross sectional view illustrating a thermoelectric device with off-set metal pads according to other embodiments of the present invention.

FIG. 5 is a cross sectional view illustrating a thermoelectric device structure according to additional embodiments of the present invention. As shown in FIG. 5, metal contacts 507 and 509 on a same thermoelectric element may be sufficiently off-set as to be non-overlapping. A separation between metal contacts 507 and 509 on a same thermoelectric element in the direction parallel with respect to surfaces of the thermoelectric element may be at least as great as a width of a contact area of a metal contact 507 or 509 on the thermoelectric element in the same direction. According to some embodiments, the separation may be at least as great as twice the width of the contact area of a metal contact on the thermoelectric element.

The structure of FIG. 5 is similar to that of FIG. 1 with the difference being that multiple off-set metal contacts 107 are provided on a same thermoelectric element. More particularly, metal contact 109 on one surface of a thermoelectric element may be centered relative to a plurality of metal contacts 107 on an opposite side of the same thermoelectric element so that the thermoelectric element does not form an unsupported cantilever. P-type thermoelectric elements 101p and n-type thermoelectric elements 101n may thus provide a more mechanically stable coupling between thermally conductive headers 103 and 105.

The thermoelectric device of FIG. 5 may be formed as discussed above with respect to FIGS. 1, 2A to 2E, 3A to 3B, and 4A to 4B, with the difference being the placement and number of metal contacts 107 and 109. According to some embodiments of the present invention, modules including one or a plurality of thermoelectric elements 101 may be formed on a diced portions of a growth substrate 151 with two metal contacts 153 on each thermoelectric element as shown in FIG. 6. More particularly, metal contacts 153 may be placed at opposite ends of each thermoelectric element. Metal contacts 153 may then be solder bonded to respective traces 111 and growth substrate 151 may be selectively removed as discussed above with respect to FIGS. 2C, 2D, 3A, and 4A. Metal contacts 161 may then be formed on newly exposed growth surfaces of the thermoelectric elements as discussed above with respect to FIG. 2E. In the device of FIG. 5, however, one metal contact 161 may be centered on each thermoelectric element 101. Each metal contact 161 may be solder bonded to a respective trace 115 using a solder bump 163 as discussed above with respect to FIGS. 2D and 2E. Accordingly, metal connections 107 and 109 of FIG. 5 may each include a metal contact and a solder bump, as well as additional layers such as barrier layers (e.g., nickel layers), adhesion layers (e.g., chromium/titanium/tungsten layers), passivation layers (e.g., gold/platinum/palladium layers), etc.

Figures 6A, 6B:
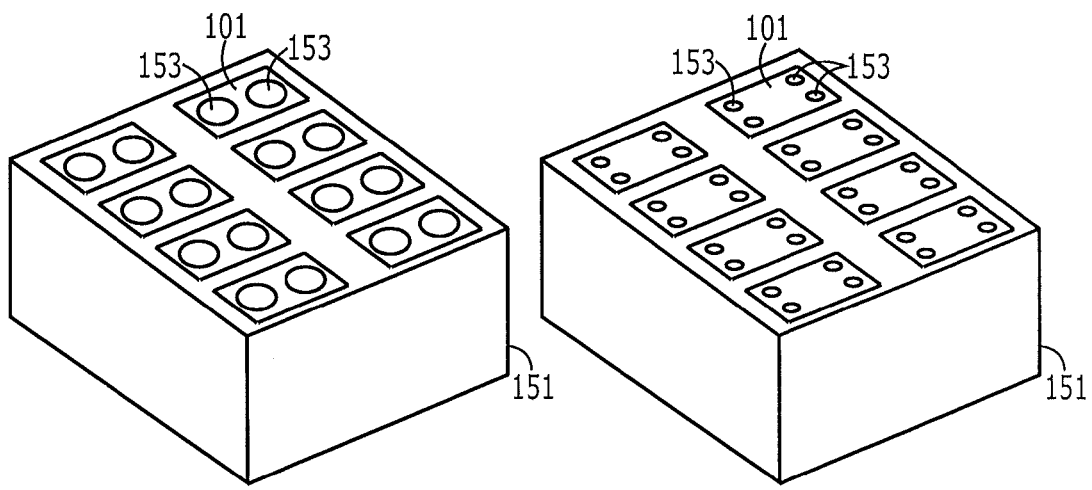
FIGS. 6A and 6B are perspective views illustrating modules of thermoelectric elements on a diced portions of growth substrates according to other embodiments of the present invention.

According to still other embodiments of the present invention, each thermoelectric element may be formed with four spaced apart metal contacts 153 at corners thereof, as shown in FIG. 6B. The thermoelectric device of FIG. 5 may thus be formed using thermoelectric elements 101 of FIG. 6B using operations discussed above with respect to FIG. 6A. While circular/oval connection pads 153 are illustrated in FIGS. 2A, 2B, 4B, 6A, and 6B, connection pads 153 may have other shapes such as square/rectangular.

Figure 7A:
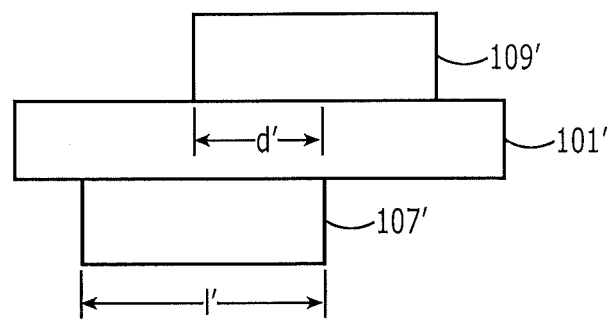
Figure 7B:
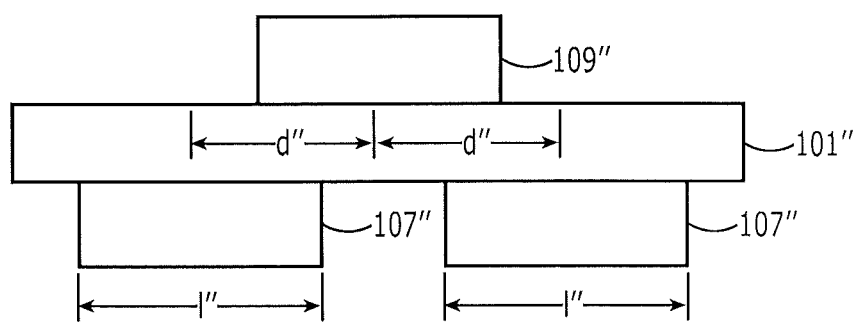

As discussed above, metal pads (e.g., metal contacts) on opposite sides of a thermoelectric element may be off-set so as to be non-overlapping, as shown in FIGS. 1, 2D, 2E, and 5. According to other embodiments of the present invention, off-set metal pads (e.g., metal contacts) on opposite sides of a same thermoelectric element may be partially overlapping as shown in FIGS. 7A and 7B. As shown in FIG. 7A, for example, one metal contact 107' and one metal contact 109' on opposite sides of thermoelectric element 101' may be off-set and partially overlapping, and the structure of FIG. 7A may be substituted for thermoelectric elements 101p/101n and metal contacts 107/109 of FIG. 1. According to some embodiments of the present invention, centers of metal contacts 107' and 109' may be off-set by a distance d' of at least half of a length l' of an interface of one of the metal contact with thermoelectric element 101' in the direction of the off-set. As shown in FIG. 7B, one metal contact 109" may be off-set and partially overlapping with respect to two metal contacts 107" on an opposite side of thermoelectric element 101', and the structure of FIG. 7B may be substituted for thermoelectric elements 101p/101n and metal contacts 107/109 of FIG. 5. According to some embodiments of the present invention, a center of metal contact 109" may be off-set with respect to centers of metal contacts 107" by a distance or distances d" greater than half of a length l" of an interface of one of the metal contact with thermoelectric element 101' in the direction of the off-set.

While the present invention has been particularly shown and described with reference to embodiments thereof; it will be understood by those of ordinary skill in the art that various changes in form and details may be made therein without departing from the spirit and scope of the present invention as defined by the following claims.

That which is claimed is:

1. A thermoelectric device comprising:
 a thermoelectric element including a layer of a thermoelectric material and having opposing first and second surfaces;
 a first metal pad on the first surface of the thermoelectric element; and
 a second metal pad on the second surface of the thermoelectric element, wherein the first and second metal pads are off-set in a first direction parallel with respect to the first and second surfaces of the thermoelectric element, wherein at least a portion of the first metal pad is non-overlapping with respect to the second metal pad in a second direction that is orthogonal with respect to the first and second surfaces of the thermoelectric element, and wherein at least a portion of the second metal pad is non-overlapping with respect to the first metal pad in the second direction;
 wherein a first axis in the second direction extends through the first pad and the first surface of the thermoelectric element, and wherein a second axis in the second direction extends through the second pad and the second surface of the thermoelectric element.

2. A thermoelectric device according to claim 1 further comprising:
a thermally conductive header adjacent the thermoelectric element wherein the second metal pad is mechanically coupled between the thermally conductive header and the thermoelectric element.

3. A thermoelectric device according to claim 2 wherein the thermoelectric element comprises an N-type thermoelectric element, the thermoelectric device further comprising:
a P-type thermoelectric element including a layer of a P-type thermoelectric material and having opposing first and second surfaces;
a third metal pad mechanically coupled between the first surface of the P-type thermoelectric element and the thermally conductive header; and
a fourth metal pad on the second surface of the P-type thermoelectric element, wherein the third and fourth metal pads are off-set in a direction parallel with respect to the first and second surfaces of the P-type thermoelectric element;
wherein an electrically conductive trace of the thermally conductive header provides electrical coupling between the second and third metal pads to define a path of current flow from the first metal pad through the N-type thermoelectric element to the second metal pad through the electrically conductive trace to the third metal pad and through the P-type thermoelectric element to the fourth metal pad.

4. A thermoelectric device according to claim 3 further comprising:
a second thermally conductive header wherein the first metal pad is mechanically coupled between the second thermally conductive header and the N-type thermoelectric element and wherein the fourth metal pad is mechanically coupled between the P-type thermoelectric element and the second thermally conductive header.

5. A thermoelectric device according to claim 1 wherein the thermoelectric material comprises a crystalline semiconductor material.

6. A thermoelectric device according to claim 1 wherein the thermoelectric material comprises a single crystal semiconductor material.

7. A thermoelectric device according to claim 1 wherein the thermoelectric material comprises bismuth telluride.

8. A thermoelectric device according to claim 1 wherein the first and second metal pads are non-overlapping in the second direction.

9. A thermoelectric device according to claim 1 further comprising:
a third metal pad on the second surface of the thermoelectric element wherein the first and third metal pads are off-set in a third direction that is parallel with respect to the first and second surfaces of the thermoelectric element, wherein the second and third metal pads are spaced apart in the first and/or third directions on the second surface of the thermoelectric element, and wherein the second and third metal pads are non-overlapping in the second direction.

10. A thermoelectric device according to claim 1 wherein the thermoelectric element has a first resistivity in the direction parallel with respect to the first and second surfaces of the thermoelectric element that is less than a second resistivity in a direction perpendicular with respect to the first and second surfaces.

11. A method of forming a thermoelectric device, the method comprising:
providing a thermoelectric element including a layer of a thermoelectric material and having opposing first and second surfaces;
forming a first metal pad on the first surface of the thermoelectric element; and
forming a second metal pad on the second surface of the thermoelectric element, wherein the first and second metal pads are off-set in a first direction parallel with respect to the first and second surfaces of the thermoelectric element, wherein at least a portion of the first metal pad is non-overlapping with respect to the second metal pad in a second direction that is orthogonal with respect to the first and second surfaces of the thermoelectric element, and wherein at least a portion of the second metal pad is non-overlapping with respect to the first metal pad in the second direction;
wherein a first axis in the second direction extends through the first pad and the first surface of the thermoelectric element, and wherein a second axis in the second direction extends through the second pad and the second surface of the thermoelectric element.

12. A method according to claim 11 further comprising:
providing a thermally conductive header including an electrically conductive trace thereon; and
electrically and mechanically coupling the second metal pad and the electrically conductive trace.

13. A method according to claim 12 wherein the thermoelectric element comprises an N-type thermoelectric element, the method further comprising:
providing a P-type thermoelectric element including a layer of a P-type thermoelectric material and having opposing first and second surfaces;
forming a third metal pad on the first surface of the P-type thermoelectric element;
electrically and mechanically coupling the third metal pad to the electrically conductive trace of the thermally conductive header so that the third metal pad is electrically and mechanically coupled between the first surface of the P-type thermoelectric element and the electrically conductive trace of the thermally conductive header; and
forming a fourth metal pad on the second surface of the P-type thermoelectric element, wherein the third and fourth metal pads are off-set in a direction parallel with respect to the first and second surfaces of the P-type thermoelectric element;
wherein the electrically conductive trace of the thermally conductive header provides electrical coupling between the second and third metal pads to define a path of current flow from the first metal pad through the N-type thermoelectric element to the second metal pad through the electrically conductive trace to the third metal pad and through the P-type thermoelectric element to the fourth metal pad.

14. A method according to claim 13 further comprising:
providing a second thermally conductive header; and
mechanically coupling the first metal pad to the second thermally conductive header so that the first metal pad is mechanically coupled between the second thermally conductive header and the N-type thermoelectric element; and
mechanically coupling the fourth metal pad to the second thermally conductive header so that the fourth metal pad is mechanically coupled between the second thermally conductive header and the P-type thermoelectric element.

15. A method according to claim 11 wherein the thermoelectric material comprises a crystalline semiconductor material.

16. A method according to claim 11 wherein the thermoelectric material comprises a single crystal semiconductor material.

17. A method according to claim 11 wherein the thermoelectric material comprises bismuth telluride.

18. A method according to claim 11 wherein the first and second metal pads are non-overlapping in the second direction.

19. A method according to claim 11 further comprising:
forming
a third metal pad on the second surface of the thermoelectric element wherein the first and third metal pads are off-set in a third direction that is parallel with respect to the first and second surfaces of the thermoelectric element, wherein the second and third metal pads are spaced apart in the first and/or third directions on the second surface of the thermoelectric element, and wherein the second and third metal pads are non-overlapping in the second direction.

20. A method according to claim 11 wherein the thermoelectric element has a first resistivity in the direction parallel with respect to the first and second surfaces of the thermoelectric element that is less than a second resistivity in a direction perpendicular with respect to the first and second surfaces.

21. A thermoelectric device according to claim 1 wherein centers of the first and second metal pads are off-set in the first direction.

22. A thermoelectric device according to claim 1 wherein portions of the first and second metal pads overlap in the second direction.

23. A method according to claim 11 wherein centers of the first and second metal pads are off-set in the first direction.

24. A method according to claim 11 wherein portions of the first and second metal pads overlap in the second direction.

* * * * *